(12) United States Patent
Gaynes et al.

(10) Patent No.: US 9,275,879 B1
(45) Date of Patent: Mar. 1, 2016

(54) MULTI-CHIP MODULE WITH REWORK CAPABILITY

(71) Applicant: INTERNATIONAL BUSINESS MACHINES CORPORATION, Armonk, NY (US)

(72) Inventors: Michael A. Gaynes, Vestal, NY (US); Jeffrey D. Gelorme, Burlington, CT (US); Jae-Woong Nah, Closter, NJ (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/456,025

(22) Filed: Aug. 11, 2014

(51) Int. Cl.
| | |
|---|---|
| *H01L 23/29* | (2006.01) |
| *H01L 21/56* | (2006.01) |
| *H01L 21/66* | (2006.01) |
| *C08G 59/24* | (2006.01) |
| *C08G 59/50* | (2006.01) |
| *H01L 21/60* | (2006.01) |

(52) U.S. Cl.
CPC ............ *H01L 21/563* (2013.01); *C08G 59/245* (2013.01); *C08G 59/5006* (2013.01); *C08G 59/5033* (2013.01); *H01L 22/14* (2013.01); *C08G 2190/00* (2013.01); *H01L 2021/60* (2013.01); *H01L 2021/60007* (2013.01)

(58) Field of Classification Search
CPC .................. H01L 21/563; H01L 2224/73203; H01L 23/293
See application file for complete search history.

(56) References Cited

U.S. PATENT DOCUMENTS

| | | |
|---|---|---|
| 5,261,156 A | 11/1993 | Mase et al. |
| 5,457,149 A | 10/1995 | Hall et al. |
| 6,057,381 A | 5/2000 | Ma et al. |
| 6,380,322 B1 | 4/2002 | Wong et al. |
| 6,570,029 B2 | 5/2003 | Wang et al. |
| 6,590,285 B1 | 7/2003 | Davis et al. |
| 6,936,664 B2 | 8/2005 | Woods et al. |
| 6,971,163 B1 | 12/2005 | Craig et al. |
| 7,074,648 B2 | 7/2006 | Cobbley et al. |
| 7,105,366 B2 | 9/2006 | Cobbley et al. |
| 7,288,161 B2 | 10/2007 | Hanley et al. |
| 7,381,590 B2 | 6/2008 | Choudhary et al. |
| 7,530,164 B2 | 5/2009 | Koning et al. |
| 7,588,968 B1 | 9/2009 | Zarbock et al. |
| 2002/0035201 A1 | 3/2002 | Wang et al. |
| 2002/0171132 A1 | 11/2002 | Buchwalter et al. |
| 2004/0155364 A1* | 8/2004 | Doba .......................... 257/789 |
| 2005/0171301 A1* | 8/2005 | Doba .......................... 525/524 |
| 2006/0014309 A1 | 1/2006 | Sachdev et al. |
| 2012/0021567 A1 | 1/2012 | Coffin et al. |
| 2012/0067871 A1 | 3/2012 | Sherrer et al. |

FOREIGN PATENT DOCUMENTS

WO        0034032        6/2000

* cited by examiner

*Primary Examiner* — Roy Potter
(74) *Attorney, Agent, or Firm* — Tutunjian & Bitetto, P.C.; Daniel P. Morris

(57) ABSTRACT

Multi-chip underfills and methods for multi-chip module fabrication include connecting one or more chips to a substrate with one or more electrical connections; partially curing an underfill material such that the underfill provides structural support to the electrical connections; electrically testing the one or more chips to identify one or more defective chips; and replacing the one or more defective chips.

19 Claims, 3 Drawing Sheets

MULTI-CHIP MODULE WITH REWORK CAPABILITY

BACKGROUND

1. Technical Field

The present invention relates to bonding chips into a multi-chip package and, more particularly, to an initial bond between chips that may be reworked before a final setting process.

2. Description of the Related Art

Multi-chip modules offer advantages in obtaining improved performance by shortening the electrical communication path between and among chips. Multi-chip modules also reduce the space needed by increasing integration. However, as the number of chips on a chip carrier increases, the likelihood that a chip will fail an electrical test increases. The defective component must somehow be repaired to allow the multi-chip module to function, either by routing functionality around the defective chip or by replacing the chip entirely.

In the case of chips on organic laminates, a thermosetting underfill is used to fill the gap between the chip and organic laminate immediately after a chip is attached. This protects solder interconnects from stress and strain that is created by the thermal expansion mismatch between silicon (e.g., 2.8 ppm/° C.) and the laminate (e.g., 17 ppm/° C.). However, conventional thermosetting underfill materials are intractable and prevent chip removal and replacement if a chip should prove to be defective during testing. As a result, there is no way to integrate testing and replacement procedures with multi-chip modules that use such underfills for mechanical reinforcement, because the underfills prevent reworking the chips.

SUMMARY

A method for multi-chip module fabrication includes connecting one or more chips to a substrate with one or more electrical connections; partially curing an underfill material such that the underfill provides structural support to the electrical connections; electrically testing the one or more chips to identify one or more defective chips; and replacing the one or more defective chips.

A method for multi-chip module fabrication includes connecting one or more chips to a substrate with one or more electrical connections; performing a partial cure of an underfill material, to about a 30% cure, such that the underfill provides structural support to the electrical connections, wherein the underfill material comprises an epoxy, a first curative that cures at a first temperature, and a second curative that cures at a second, higher temperature; electrically testing the one or more chips to identify one or more defective chips; replacing the one or more defective chips; and fully curing the underfill material by heating the underfill material to a higher temperature than that at which the partial cure was performed.

A chip underfill material includes an epoxy; a first curative that cures at a first temperature; and a second curative that cures at a second, higher temperature.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Embodiments of the present invention employ latently curing underfills that provide structural support, while still allowing for reworking and removal of chips if a chip fails an electrical test or otherwise proves to be defective. The latently curing underfill is formulated such that, after exposure to solder reflow, the underfill has only cured, e.g., about 30%. This is sufficient curing to protect the solder joints as well as fragile low-k dielectric structures on a chip. However, if needed, the chip can be removed with normal rework equipment and the remaining underfill on the chip site may be removed with common solvents.

To accomplish this partial cure, embodiments of the present invention employ a two-stage cure. A first cure process partially cures the underfill, while a second cure process finishes the cure to provide more complete structural support. This may be accomplished by, for example, using a compound curative that has multiple different curatives in it, each triggered by different conditions.

Figure 1:
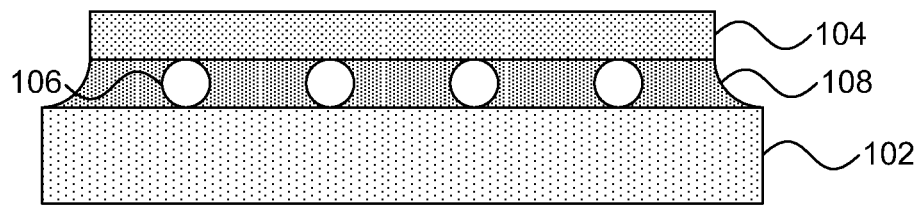
FIG. 1 is a cross-sectional view of a chip underfill in accordance with the present principles.

Referring now to the drawings in which like numerals represent the same or similar elements and initially to FIG. 1, an exemplary multi-chip module is shown. A substrate 102 is formed from, e.g., a semiconductor or organic laminate material. This laminate may be a printed circuit board formed from, e.g., a thermosetting resin that has been impregnated into glass cloth, where sheets of the resin impregnated glass cloth are laminated together to form along with personalized layers of copper circuitry and copper planes. A chip 104, again formed from a semiconductor or organic laminate material, is bonded to the substrate 102 by solder connections 106. It should be understood that any number of chips 104 may be placed on the substrate 102, both arranged laterally and stacked one on top of another. It should also be understood that, although the present embodiments are described specifically with respect to the use of solder for connections 106, any suitable means of attaching the chips 104 to the substrate 102 may be employed, using solder or any other appropriate fixative.

The connections 106 can be fragile, so an underfill 108 is added and partially cured to provide structural support. The underfill 108 may be any appropriate polymerizable material, and in particular it is contemplated that a latently curing epoxy may be used. It is specifically contemplated that the epoxy may have two separate curative materials—a first curative material that is sufficient to cure 30% of the underfill 108 at a first temperature and a second curative material that is sufficient to cure the remaining 70% of the underfill 108 at a second, higher temperature. In one example, the first cure may be performed at a relatively high temperature during a solder reflow process, using a temperature of, e.g., about 230° C. for about 90 seconds.

It is specifically contemplated that the underfill 108 may be an organic epoxy material. In one exemplary embodiment, the underfill 108 may be diglycidylether bisphenol A (any other aromatic difunctional bisphenol such as F, S, or O) having two different types of a difunctional amine curative.

The curatives may include, for example, a faster-reacting aliphatic amine such as 1,4 or 1,3 butane diamine sufficient in amount to cure 30% of the underfill 108 and a slower-reacting aromatic ring amine such as 1,4 or 1,3 phenylene diamine or diaminosulfone diamine sufficient in amount to cure the uncured remainder of underfill 108. The aliphatic amine wholly or partially reacts with the epoxy resin of the underfill 108 at room temperature or slightly above, leaving the underfill 108 partially cured. The full cure is accomplished at a later time increasing the temperature to, e.g., 100° C., causing the remaining underfill 108 to cure with the second curative.

Another way to provide two different rates of reaction for an epoxy ring with an amine curing agent is to vary the substitution of nitrogen atoms. For example, a primary amine has two hydrogen atoms connected to the nitrogen atom and a tertiary amine has no hydrogen atoms. Instead, the tertiary amine has only carbon groups such as methane or any other aliphatic substance. One example is the difference between aniline, where nitrogen has two hydrogen atoms, and dimethyl aniline or dimethylene benzene, where the nitrogen has no free hydrogens. These two forms of amines have different rates of reaction toward epoxide ring opening and can be combined in an epoxy formulation to provide different curing rates at different temperatures.

A further method for creating an underfill formulation with two curing rates is to change the environment of the nitrogen forming the amine. If the nitrogen is connected to a primary carbon atom, such as in ethylaniline, the effective reaction rate of this amine with an epoxy would be faster than an amine group connected to a tertiary carbon, as in t-butylamine. It should be understood that the specific examples cited above are not intended to be limiting. Those having ordinary skill in the art will be able to devise suitable underfill materials to accomplish the partial cure within the scope of the present principles.

It is to be understood that the present invention will be described in terms of a given illustrative architecture having a wafer; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Figure 2:
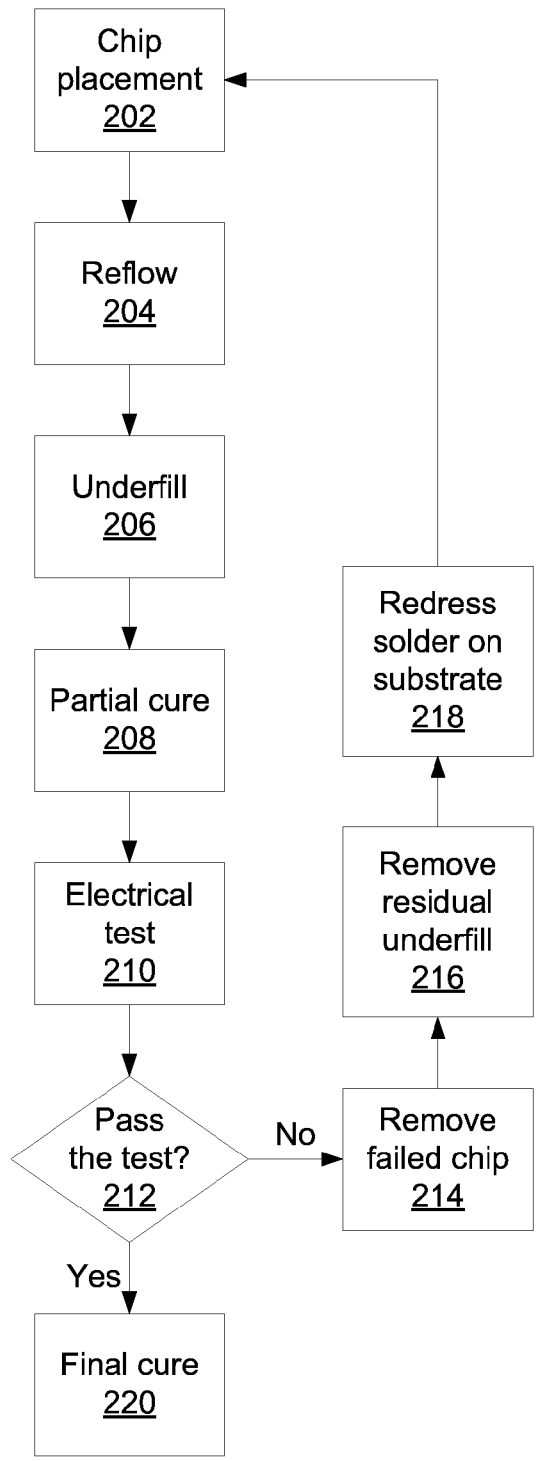
FIG. 2 is a method for providing reworkable multi-chip packages in accordance with the present principles.

Referring now to FIG. 2, a method for forming a multi-chip module with rework capability is shown. Block 202 places a first chip 104 on a substrate 102. Chip placement 202 may further stack additional chips on top of chip 104 or may arrange additional chips laterally around chip 104, with solder connections therebetween. The substrate 102 may have solder 106 or solder paste already in place at the intended contact points, such that contacts on the chip 104 line up with the solder placement. Block 204 reflows the solder 106, creating electrical and structural connections between the substrate 102 and the chip 104. It should be noted that this process may include the application and subsequent washing of flux from the surface of the chip 104 and/or the substrate 102.

Block 206 deposits an underfill 108 that occupies the space between the substrate 102 and the chip 104. If multiple chips 104 are stacked, the underfill 108 should be filled to a depth sufficient to cover all solder joints. It should be noted that this is only one embodiment for underfill deposition—as will be described in greater detail below, the underfill 108 may alternatively be deposited beforehand as a paste or as a layer of a chip wafer. Regardless of the manner of deposition, block 208 performs a partial cure of the underfill 108. As described above, this partial cure may be accomplished by, e.g., exposing a lower-temperature curative to its curing temperature. This partial cure produces, for example, a 30% cure—enough to protect the structure of the solder 106 without being unreworkable. It should be understood that this 30% is an approximate number and that any partial cure will suffice as long as it protects the solder 106 while still allowing the chip 104 to be separated from the substrate 102 if needed. The appropriate percentage for the partial cure will therefore vary depending on the reworking techniques and equipment available, as well as the properties of connections 106.

Block 210 performs an electrical test on the chip(s) 104. These electrical tests may include any appropriate tests including, but not limited to, connectivity tests, FET emission tests, etc. Block 212 determines whether the chip(s) 104 pass the test. Failure of the electrical tests of block 210 indicates some malfunction or defect that necessitates replacement. If the chip(s) 104 do pass the test, block 220 performs a final cure by, for example, heating the underfill 108 to a temperature sufficient to trigger a latent cure, providing additional support to the connections 106.

If the chip(s) 104 fail the electrical test of block 210, it is determined that one or more of said chip(s) 104 is defective. Block 214 removes the defective chip using conventional rework tools, made possible by the partially cured underfill 108. Block 214 may apply heat and mechanical tensile force to remove the chip 104. Additionally, shear force created by rotating the chip about five degrees may be used to remove the chip 104.

If any underfill material 108 remains on the chip carrier site(s) after removing the chip, block 216 removes residual underfill using, e.g., an appropriate solvent such as acetone, methyl ethyl ketone, etc., while protecting the underfill 108 of the good chip(s). This protection may be accomplished by mechanically isolating the site of the defective chip from other good chips. A removable seal/dam can be positioned around the site of interest during solvent removal of the residual underfill. As needed, a solder site dress may be performed and textured copper foil, similar to peel-apart copper foil historically used in printed circuit board lamination, may be placed on the reworked site and heated to solder reflow temperatures. This localized heating provides the ability to pick up excess solder and to level residual molten solder that remained on the chip carrier pads after the chip 104 was removed.

Enhanced removal of residual material in block 216 may be accomplished with a plasma or reactive ion etch if needed. A further option for removing residual underfill 108 includes making a paste combining a solvent with a silica thixotrope. The paste allows local application in a chip site area only, with no contact with adjacent good chip sites that have partially cured underfill 108.

It should be noted that, on subsequent iterations of the process of FIG. 2, the reflow and curing steps need only be performed locally to the chips 104 that have been replaced. This is important, as heating the chips 104 that were verified as working in block 210 above the reflow temperature may damage the solder connections. The local heating may be performed using hot air, lasers, or any other heating technique that can be tightly controlled in its area of effect. Optionally, a barrier may be placed between the rework area and the chips 104 that have passed electrical tests, preventing the heat from the rework process from affecting the surrounding structures.

Figure 3:
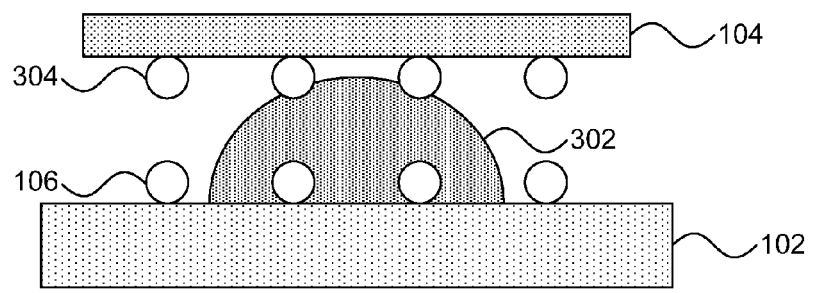
FIG. 3 is a cross-sectional view of a chip underfill in accordance with the present principles.

Referring now to FIG. 3, an alternative to depositing underfill 108 after reflow step 204 is shown. In this embodiment, underfill material 302 is deposited on the substrate 102 in the form of a non-conductive paste. The chip 104 is then attached to the substrate 102 by thermal compression bonding. To aid in alignment, the chip 104 may have solder 304 of its own. The chip solder 304 makes contact with the substrate solder 106 and displaces any underfill material 302 in the way. The partial cure of block 208 may then be combined with the reflow step of block 204. Although the reflow is performed at high temperatures, it is too brief to trigger a full cure.

Figure 4:
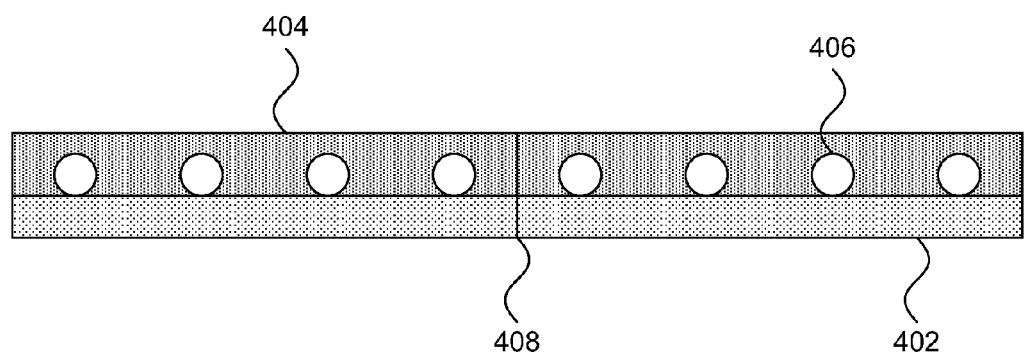
FIG. 4 is a cross-sectional view of a chip underfill in accordance with the present principles.

Referring now to FIG. 4, an alternative to depositing underfill 108 after reflow step 204 is shown. A set of chips 402 is formed as part of a single wafer with solder points 406 and a wafer level underfill 404. The wafer level underfill 404 may be formed by spinning a low-viscous material onto the chips 402 and using a b-stage cure. The b-stage cure allows a solvent to evaporate, thereby increasing the viscosity of the wafer level underfill 404 to keep the material from falling away from the chips 402.

The chips 402 may be cut along chip boundaries 408 to separate the wafer into usable components. The chips 402 may then be flipped and applied to a substrate 102 as above. The wafer level underfill 404 will become less viscous during the reflow step 204 and surround the new solder joints, providing structural support after its partial cure.

In each of the above examples, whether by capillary movement or by compression, the underfill material is introduced in such a way that it fills the gaps between the solder points 106. The partially cured provides a secure protective layer around the solder points 106. It should be noted that the present embodiments provide curative mixtures specifically designed to produce a reworkable partial cure of about 30%, whether as a part of the solder reflow for points 106 or as a separate step, while still providing a full cure at a later point. Using a curative that finishes the cure at, or slightly above, room temperature makes the finishing step particularly economical, and the time to produce the final cure can be calibrated to permit ample time to rework the chips as needed.

Having described preferred embodiments of a system and method for reworking multi-chip modules (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for multi-chip module fabrication, comprising:
    applying an underfill material either to a substrate or to one or more chips;
    connecting the one or more chips to the substrate with one or more electrical connections after applying the underfill material;
    partially curing the underfill material such that the underfill provides structural support to the electrical connections;
    electrically testing the one or more chips to identify one or more defective chips; and
    replacing the one or more defective chips.

2. The method of claim 1, wherein applying the underfill material comprises forming a wafer level underfill on the one or more chips.

3. The method of claim 2, wherein forming the wafer level underfill comprises spinning the underfill material onto the one or more chips or onto the substrate and performing a b-stage cure of the underfill material.

4. The method of claim 1, further comprising:
depositing the underfill material onto the substrate; and
placing the chips onto the substrate such that the underfill is displaced by electrical contacts.

5. The method of claim 1, further comprising fully curing the underfill material after the one or more defective chips are replaced.

6. The method of claim 5, wherein the underfill material comprises an epoxy, a first curative that cures at a first temperature, and a second curative that cures at a second, higher temperature.

7. The method of claim 6, wherein fully curing the underfill material comprises heating the underfill material to a higher temperature than a temperature used to partially cure the underfill material.

8. The method of claim 6, wherein the underfill material comprises an amount of the first curative sufficient to reach about a 30% cure of the underfill material.

9. The method of claim 1, wherein replacing one or more the defective chips comprises:
removing the one or more defective chips;
removing residual partially cured underfill material;
removing residual solder from the substrate;
connecting one or more replacement chips to the substrate with one or more electrical connections;
partially curing a replacement underfill material; and
electrically testing the one or more replacement chips.

10. A method for multi-chip module fabrication, comprising:
connecting one or more chips to a substrate with one or more electrical connections;
performing a partial cure of an underfill material such that the underfill provides structural support to the electrical connections, wherein the underfill material comprises an epoxy, a first curative that cures at a first temperature, and a second curative that cures at a second, higher temperature;
electrically testing the one or more chips to identify one or more defective chips;
replacing the one or more defective chips; and
fully curing the underfill material by heating the underfill material to a higher temperature than that at which the partial cure was performed.

11. The method of claim 10, further comprising depositing the underfill material between the one or more chips and the substrate after connecting the one or more chips to the substrate.

12. The method of claim 10, further comprising forming a wafer level underfill on the one or more chips prior to connecting the one or more chips to the substrate.

13. The method of claim 12, wherein forming the wafer level underfill comprises spinning the underfill material onto the one or more chips or onto the substrate and performing a b-stage cure of the underfill material.

14. The method of claim 10, further comprising:
depositing the underfill material onto the substrate; and
placing the chips onto the substrate such that the underfill is displaced by electrical contacts.

15. The method of claim 10, wherein replacing one or more the defective chips comprises:
removing the one or more defective chips;
removing residual partially cured underfill material;
removing residual solder from the substrate;
connecting one or more replacement chips to the substrate with one or more electrical connections;
partially curing a replacement underfill material; and
electrically testing the one or more replacement chips.

16. The method of claim 10, wherein the underfill material comprises an amount of the first curative sufficient to reach about a 30% cure of the underfill material.

17. A chip underfill material comprising:
an epoxy;
a first curative comprising an aliphatic amine that cures at a first temperature; and
a second curative comprising an aromatic ring amine that cures at a second, higher temperature,
wherein a proportion of first curative to the epoxy is sufficient to partially cure the epoxy to a degree that provides structural support to components in the epoxy while remaining heat reworkable.

18. The chip underfill material of claim 17, wherein the epoxy is a diglycidylether of a difunctional bisphenol and wherein the first and second curatives are difunctional amine curatives.

19. The chip underfill material of claim 17, wherein the first curative is one of the group consisting of 1,4 and 1,3 butane diamine and wherein the second curative is one of the group consisting of 1,4 phenylene diamine, 1,3 phenylene diamine, and diaminosulfone diamine.

* * * * *